United States Patent
Ohtomo et al.

(10) Patent No.: US 6,796,040 B2
(45) Date of Patent: Sep. 28, 2004

(54) LINE LASER DEVICE

(75) Inventors: Fumio Ohtomo, Tokyo-to (JP); Jun-ichi Kodaira, Tokyo-to (JP)

(73) Assignee: Kabushiki Kaisha TOPCON, Tokyo-to (JP)

( * ) Notice: Subject to any disclaimer, the term of this patent is extended or adjusted under 35 U.S.C. 154(b) by 0 days.

(21) Appl. No.: 10/320,152

(22) Filed: Dec. 16, 2002

(65) Prior Publication Data

US 2003/0123153 A1 Jul. 3, 2003

(30) Foreign Application Priority Data

Dec. 28, 2001 (JP) .......................................... 2001-400630

(51) Int. Cl.$^7$ .............................................. G01C 15/00
(52) U.S. Cl. .............................. 33/286; 33/227; 33/228; 33/DIG. 21; 359/799; 359/800; 362/268; 362/259
(58) Field of Search ........................... 33/227, 228, 281, 33/282, 285, 286, DIG. 21; 359/819, 800, 799; 362/268, 259

(56) References Cited

U.S. PATENT DOCUMENTS

| | | | | |
|---|---|---|---|---|
| 3,915,575 A | * | 10/1975 | Sick ............................ | 33/286 |
| 4,948,210 A | * | 8/1990 | Simms ........................ | 359/356 |
| 5,218,770 A | * | 6/1993 | Toga ........................... | 33/227 |
| 5,539,990 A | * | 7/1996 | Le ............................... | 33/281 |
| 5,819,424 A | * | 10/1998 | Ohtomo et al. .............. | 33/286 |
| 5,838,431 A | * | 11/1998 | Hara et al. ............. | 33/DIG. 21 |
| 5,983,510 A | * | 11/1999 | Wu et al. ..................... | 33/227 |
| 6,005,719 A | * | 12/1999 | Rando .......................... | 33/286 |
| 6,526,089 B1 | * | 2/2003 | Haeno et al. ................ | 33/286 |
| 6,588,115 B1 | * | 7/2003 | Dong ........................... | 33/227 |
| 6,679,609 B2 | * | 1/2004 | Ohtomo et al. .............. | 33/227 |
| 2001/0029675 A1 | * | 10/2001 | Webb ........................... | 33/286 |

* cited by examiner

Primary Examiner—Christopher W. Fulton
Assistant Examiner—Madeline Gonzalez
(74) Attorney, Agent, or Firm—Nields & Lemack

(57) ABSTRACT

A line laser device, comprising a light source for emitting a laser beam, a light emitting unit having optical means for projecting the laser beam from the light source in fan-like shape, an optical member arranged on the fan-shaped laser beam and for forming a spot light on a part of the fan-shaped laser beam, and support means for supporting the optical member so that the spot light formed on the fan-shaped laser beam can be shifted.

9 Claims, 8 Drawing Sheets

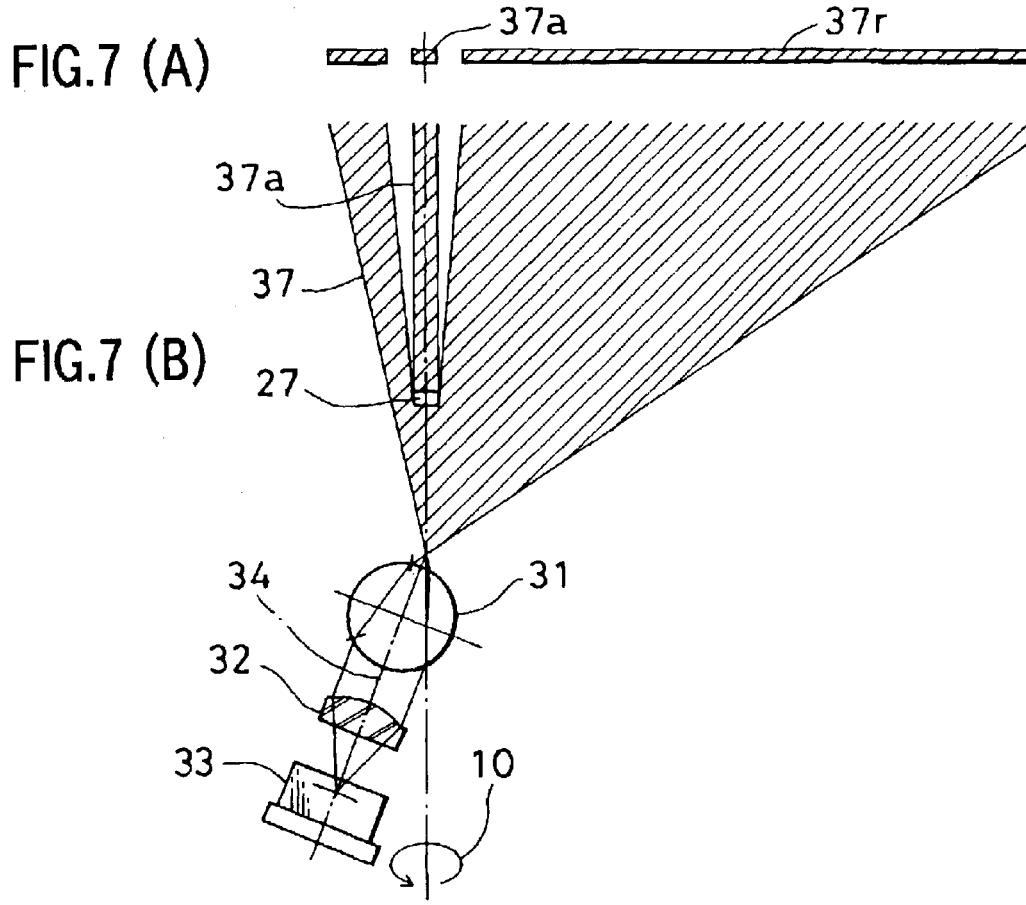
FIG.7 (A)
FIG.7 (B)
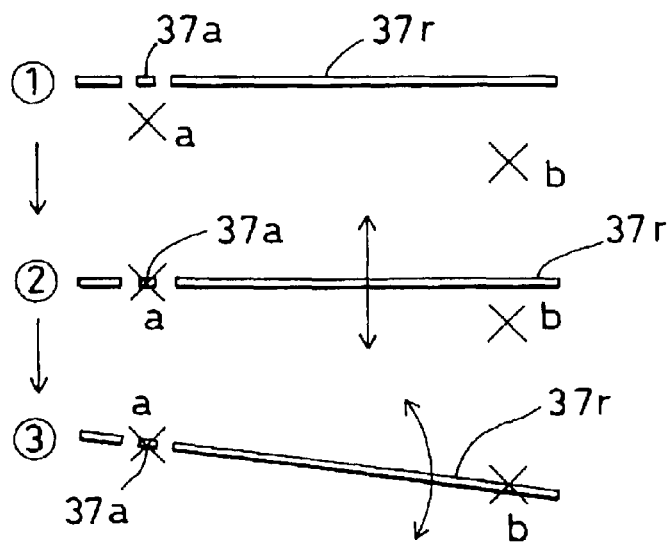
FIG.8

LINE LASER DEVICE

BACKGROUND OF THE INVENTION

The present invention relates to a laser device, and in particular, to a simplified type line laser device using a rod lens and for projecting a laser beam in fan-like shape.

A laser device is used for the purpose of forming a reference plane in operation such as construction work or civil engineering work. As a simplified type laser device, a line laser device is known, which uses a rod lens and projects a fan-shaped laser beam. This simplified type laser device has a single function and is low-cost.

Description will be given below on a conventional type line laser device referring to FIG. 14 and FIG. 15.

A base plate 2 is mounted on a leveling base 1, and a housing 4 is rotatably mounted on the base plate 2 via a bearing 3.

The leveling base 1 comprises a pedestal 5 and three leveling screws 6. By rotating the leveling screws 6 at adequate positions, the base plate 2 can be leveled in a horizontal direction.

A laser beam projecting unit 7 is mounted inside the housing 4. The laser beam projecting unit 7 has a projecting light optical axis 8 running perpendicularly to a rotation shaft of the housing 4, and it comprises a light emitting source 9 such as a diode laser for emitting a laser beam 13 on the projected light optical axis 8, a collimator lens 11 for turning the laser beam 13 emitted from the light emitting source 9 to a parallel beam, and a rod lens 12 having an optical axis perpendicular to an optical axis of the collimator lens 11 and also running perpendicularly to the rotation shaft of the housing 4.

The laser beam 13 emitted from the light emitting source 9 is turned to a parallel beam by the collimator lens 11. The beam is then spread in a horizontal direction by the rod lens 12 and are projected through a projection window 14 of the housing 4.

The laser beam 13 spread in a horizontal direction is projected as a fan-shaped laser beam and forms a horizontal reference plane. When the laser beam is projected to a wall surface or the like, a reference line is formed on the projected surface. A spread angle of the laser beam 13 is about 100°. When an operating position is deviated from the horizontal reference plane, the housing 4 is manually rotated as appropriate. That is, by rotating the housing 4, a horizontal reference plane or a reference line of the laser beam can be obtained over total circumference.

The laser line formed by the projection of the fan-shaped laser beam 13 to a wall surface or the like is used as a reference line instead of a marking line. Operation can be performed without leaving stain the wall surface and the like, or the reference line can be confirmed at any time after the completion of the work, and it is very convenient.

When a tilted laser line is formed by the line laser device, it is necessary to form the tilted laser line in alignment with a marked line, with a tilted portion or with two indicated points. To form an accurate tilted laser line, it is desirable to superimpose the line on the tilted portion, etc. used as reference.

The laser line is tilted and is aligned with a tilted marked line or with the tilted portion. If the tilting is not aligned, the laser line should be tilted further. However, in the conventional type line laser device as described above, it is not exactly known which part of the laser line is the center, and which part is used as the center of the tilting. When it is tried to tilt the laser line again, deviation occurs with respect to the line used as reference or to the tilted portion. For this reason, additional operation is required to repeat the procedure to align with the marked line or the tilted portion.

If alignment must be made between two indicated points or two points, it is more difficult to work. The work of alignment is performed in the same manner as the line or the tilted portion. However, it is not easy to perform the alignment, because two points are not visible tilted reference such as the line or the tilted portion.

At the construction site including room interior finishing work, etc., the above working procedure must be repeatedly performed. Therefore, efficiency of the above working is poor. The poor working efficiency causes serious problem.

SUMMARY OF THE INVENTION

It is an object of the present invention to provide a line laser device, by which it is possible to form a point on a part of a fan-shaped laser beam and to make it easier to perform positioning of a laser line formed by the laser beam so as to improve working efficiency.

To attain the above object, the line laser device according to the present invention comprises a light source for emitting a laser beam, a light emitting unit having optical means for projecting the laser beam from the light source in fan-like shape, an optical member arranged on the fan-shaped laser beam and for forming a spot light on a part of the fan-shaped laser beam, and support means for supporting the optical member so that the spot light formed on the fan-shaped laser beam can be shifted. Also, the present invention provides the line laser device as described above, wherein the support means rotatably supports the optical member so that the optical member can be rotated around a focal point of the optical means. Further, the present invention provides the line laser device as described above, wherein the light emitting unit is supported so that the light emitting unit can be rotated around the focal point of the optical means. Also, the line laser device of the present invention comprises at least two sets of laser projection units and a guide member, wherein the laser projection unit comprises a light source for emitting a laser beam, a light emitting unit having optical means for emitting the laser beam from the light source in fan-like shape, an optical member arranged on the fan-shaped laser beam and for forming a spot light on a part of the fan-shaped laser beam, and support means capable to shift the optical member along the fan-shaped laser beam, wherein the two sets of laser projection units are supported as independently movable along the guide member. Further, the present invention provides the line laser device as described above, wherein the guide member is rotatably supported. Also, the line laser device of the present invention comprises at least two sets of laser projection units and a guide member, wherein the laser projection unit comprises a light source for emitting a laser beam, a light emitting unit having optical means for emitting the laser beam from the light source in fan-like shape, an optical member arranged on the fan-shaped laser beam and for forming a spot light on a part of the fan-shaped laser beam, and support means capable to shift the optical member along the fan-shaped laser beam, wherein the two sets of laser projection units are movably supported along the guide member, and one of the laser projection units can be rotated with respect to the other of the laser projection unit. Further, the present invention provides the line laser device as described above, wherein the light emitting unit can be rotated around an optical axis of the optical member to form the spot light. Also, the line laser device of the present invention comprises a light emitting unit having a light source to emit a laser beam, a circular cylindrical lens, optical means for deflecting the laser beam so that the laser beam enters in a direction perpendicular to the center line of the circular cylindrical lens, optical means retaining member for rotatably supporting the optical means around the center line of the circular cylindrical lens, and an optical member movably supported along the fan-shaped laser beam by the optical means retaining member and for forming a spot light. Further, the present invention provides the line laser device as described above, wherein the light emitting unit can be rotated around an optical axis of the light source to form the spot light. Also, the present invention provides the line laser device as described above, wherein the optical means comprises a corner prism and a pentagonal prism, and the laser beam passing through the circular cylindrical lens along the center line is deflected so that the laser beam enters the circular cylindrical lens in a direction perpendicular to the center line of the circular cylindrical lens. Further, the present invention provides the line laser device as described above, wherein the optical means comprises a rhombic prism and a pentagonal prism, and the laser beam from the light source is deflected so that the laser beam enters the circular cylindrical lens in a direction perpendicular to the center line of the circular cylindrical lens. Also, the present invention provides the line laser device as described above, wherein the optical means has one of a circular cylindrical lens, a cylindrical lens, a Fresnel lens, or a binary element as the optical member for diffusing a light beam of the laser beam in fan-like shape. Further, the present invention provides the line laser device as described above, wherein the optical member to form the spot light is one of a cylindrical lens, a spherical lens, a Fresnel lens, or a binary element.

BRIEF DESCRIPTION OF THE DRAWINGS

FIG. 7(A) and FIG. 7(B) each represents a drawing to explain operation of the first embodiment;

FIG. 8 is a drawing to explain the condition of a reference line formed during operation of the first embodiment;

DETAILED DESCRIPTION OF THE PREFERRED EMBODIMENTS

Figure 1:
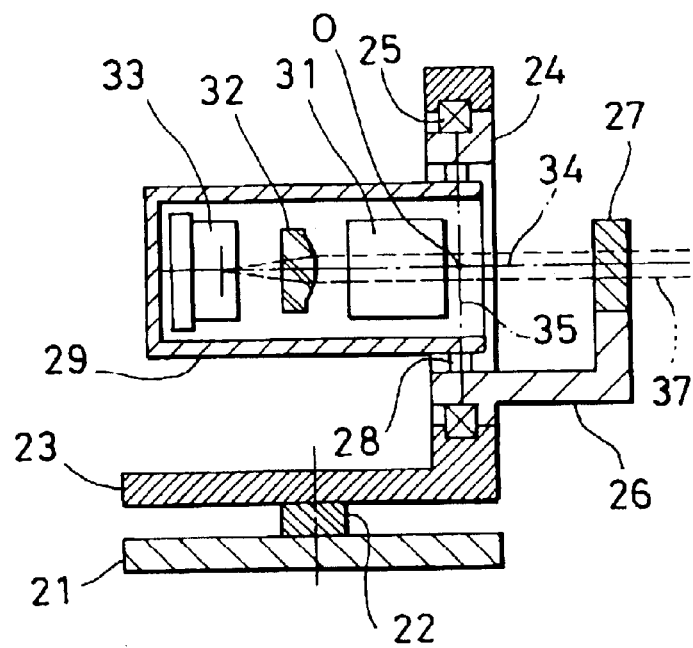
FIG. 1 is a frontal cross-sectional view to show a first embodiment of the present invention.

Description will be given below on embodiments of the present invention referring to the drawings.

A first embodiment will be described referring to FIG. 1 and FIG. 2.

An L-shaped direction rotating frame 23 is rotatably mounted on a base 21 via a direction rotating shaft 22 having a vertical axis. A tilting frame 24 in approximately ring-like shape is rotatably mounted around a horizontal axis on a vertical portion of the direction rotating frame 23 via a bearing 25. The tilting frame 24 is provided with a lens holder 26 extending in a horizontal direction. A cylindrical lens 27 is mounted on the lens holder 26. An angle scale 30 is provided on a peripheral portion of the tilting frame 24, and the tilting frame 24 can be retained at any position as desired with respect to the direction rotating frame 23.

A light emitting unit holder 29 is oscillatably mounted on the tilting frame 24 via an oscillating shaft 28 having a vertical axis, and the light emitting unit holder 29 can be fixed at an adequate oscillating position with respect to the tilting frame 24. The light emitting unit holder 29 has a hollow inner space. In the inner space, a circular cylindrical lens 31, a condenser lens 32, and a light source (preferably a laser diode) 33 are arranged on a same optical axis 34 as seen from the oscillating shaft 28 side, and the optical axis 34 perpendicularly crosses an axis 35 of the oscillating shaft 28. Although not shown particularly in the figure, a small power source such as a battery is accommodated in the light emitting unit holder 29 in order to supply power to drive the laser diode 33.

The center line of the circular cylindrical lens 31 and the center line of cylindrical curved surface of the cylindrical lens 27 are both running in parallel to the axis 35. Intersection of the axis 35 with the optical axis 34 concurs with a beam-converging point O (focal point of the circular cylindrical lens 31) of the laser beam 37, which is converged by the circular cylindrical lens 31. The rotation center of the tilting frame 24 passes through the beam-converging point O.

Figure 3:
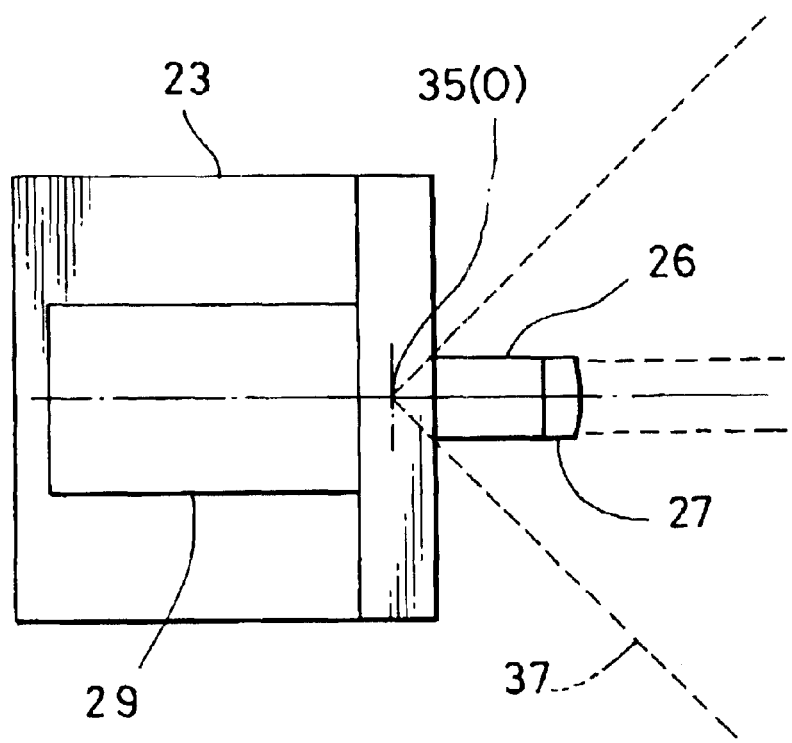
FIG. 3 is a plan view of the first embodiment.

FIG. 3 shows relation between the oscillating shaft 28 of the light emitting unit holder 29, the axis 35 of the oscillating shaft 28, the beam-converging point O of the circular cylindrical lens 31, the laser beam 37 spread in fan-like shape, and the cylindrical lens 27 on the laser beam 37.

By the cylindrical lens 27 on the laser beam 37 spread in fan-like shape, a part of the fan-shaped laser beam 37 forms a spot light. The axis 35 of the oscillating shaft 28 of the light emitting unit holder 29 concurs with the beam-converging point O of the circular cylindrical lens 31, and the light emitting unit holder 29 is oscillated around the beam-converging point O. With respect to the projecting direction of the laser beam 37, the rotation center of the tilting frame 24 concurs with the optical axis 34, and the cylindrical lens 27 is positioned on the extension of this line.

Now, description will be given on operation of the present embodiment referring to FIG. 4 to FIG. 7.

Figure 4:
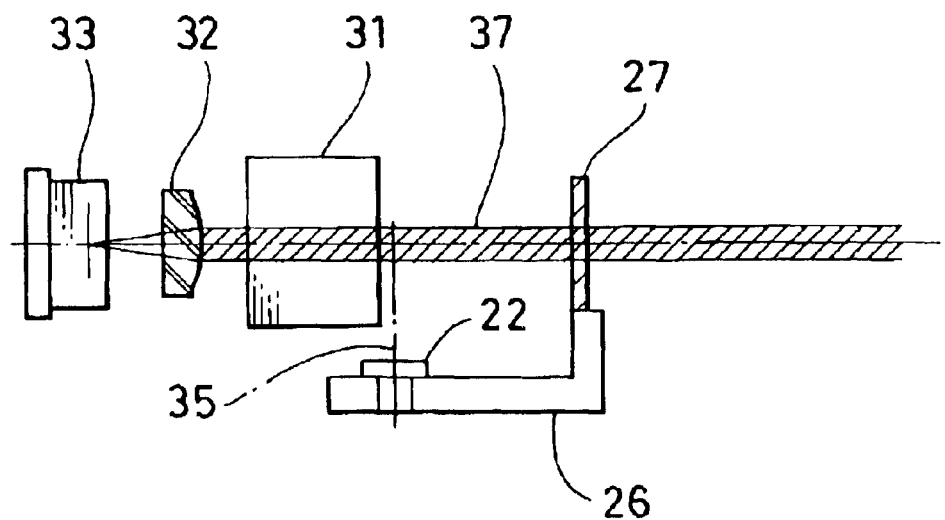
FIG. 4 is a front view of an optical system of the first embodiment.
Figure 5:
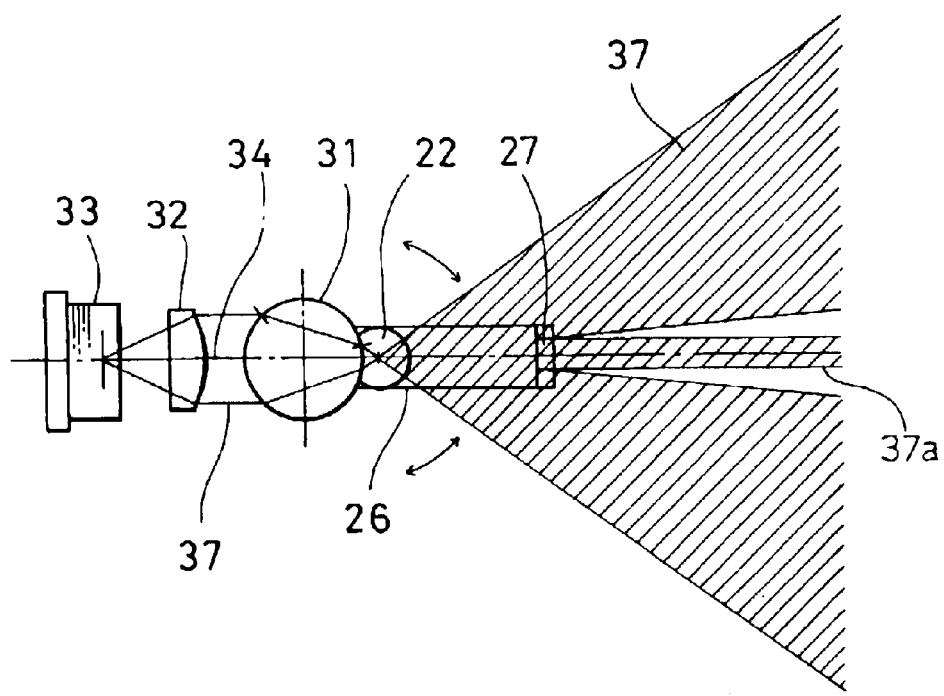
FIG. 5 is a plan view of an optical system of the first embodiment.
Figure 6:
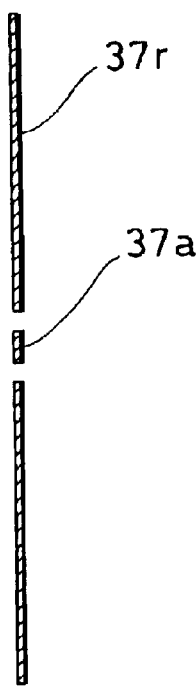
FIG. 6 is a drawing to explain a laser beam projected from the optical system of the first embodiment.

FIG. 4 to FIG. 6 each represents a condition where a spreading direction of the projected laser beam 37 is in a horizontal direction.

The laser beam 37 emitted from the laser diode 33 is turned to a parallel beam by the condenser lens 32. After passing through the circular cylindrical lens 31, the laser beam 37 is refracted only in a horizontal direction. The beam is converged on the axis 35, and the beam is further spread in fan-like shape and is projected.

A focal length and position of the cylindrical lens 27 are set in such manner that the light beam projected from the circular cylindrical lens 31 is turned to a parallel beam.

After passing through the cylindrical lens 27, a part of the laser beam 37 is turned to a parallel-beam spot light 37a, and the remaining light components are spread in fan-like shape. Therefore, as seen in FIG. 5, a portion without light beam is generated between the spot light 37a and the laser beam 37. As a result, a spot (the spot light 37a) is formed on the laser line as shown in FIG. 6.

Accordingly, for the purpose of setting the laser line as a reference line 37r using a specific point as reference, it is necessary to set the base 21 to a required height, to perform leveling in a horizontal direction, to drive the laser diode 33, to project the laser beam 37, to rotate the direction rotating frame 23 and to align the spot light 37a formed by the cylindrical lens 27 with the specific point. The operation of the setting of the reference line is an operation to align a point with a point. Thus, the operation is easy to carry out and the operation accuracy is high.

To take the measure from the specific point on the reference line 37r, it should be performed by using the spot light 37a as reference, and the operation can be carried out in simple and accurate manner.

When the operation point is somewhat far from the specific point or when it is wanted to shift the reference line 37r in a horizontal direction without changing the condition of the projection of the spot light 37a to the specific point, the light emitting unit holder 29 should be oscillated around the oscillating shaft 28 with respect to the tilting frame 24.

FIG. 7 shows the condition where the light emitting unit holder 29 is oscillated.

As described above, when the light emitting unit holder 29 is oscillated, the light emitting unit holder 29 is rotated around the beam-converging point O, and the fan-shaped laser beam 37 is also rotated. Therefore, a projecting position of the laser beam 37 is shifted by a rotation angle of the optical axis 34. However, the cylindrical lens 27 is not moved, and the optical axis of the cylindrical lens 27 is still directed toward the specific point. Also, the beam-converging point O of the laser beam 37 is not changed and the condition of the light beam entering the cylindrical lens 27 is also not changed. As a result, the spot light 37a is projected to the specific point by the cylindrical lens 27. Specifically, it is possible to shift the reference line 37r while maintaining the projecting position of the spot light 37a at a constant point.

To change a projecting point of the laser beam 37, the direction rotating frame 23 should be rotated.

When the direction rotating shaft 22 is designed, not as a single rotation shaft, but as a spherical seat structure, which can be rotated in any direction, it is possible to rotate the direction rotating frame 23 not only in a direction angle (azimuth) but also to a higher or lower direction, and to shift the laser line in a lower or higher direction.

Next, description will be given on a case where the laser beam 37 is tilted.

In order to tilt the reference plane and the projected laser line formed by the laser beam 37, the tilting frame 24 should be rotated (See reference numeral 10 in FIG. 7(B)). An amount of rotation (tilt angle) can be set to a desired value by using the angle scale 30.

The rotation center of the tilting frame 24 concurs with the optical axis of the cylindrical lens 27, and the light emitting unit holder 29 is integrally rotated with the cylindrical lens 27. Thus, there is no change in the relation between the cylindrical lens 27 and the light emitting unit holder 29. Even when the tilting frame 24 is rotated, the projecting position of the spot light 37a is not changed.

Referring to FIG. 8, description will be given below on a case where a tilted reference line 37r which passes through specific points a and b is obtained. First, the spot light 37a is shifted in a vertical direction and a horizontal direction, and the spot light 37a is aligned with the specific point a. Then, the tilting frame 24 is rotated, and the reference line 37r is tilted and adjusted so as to pass through the specific point b.

When the reference line 37r is tilted, the spot light 37a is not shifted, and the tilted reference line 37r passing through the specific points "a" and "b" can be easily obtained.

Figure 9:
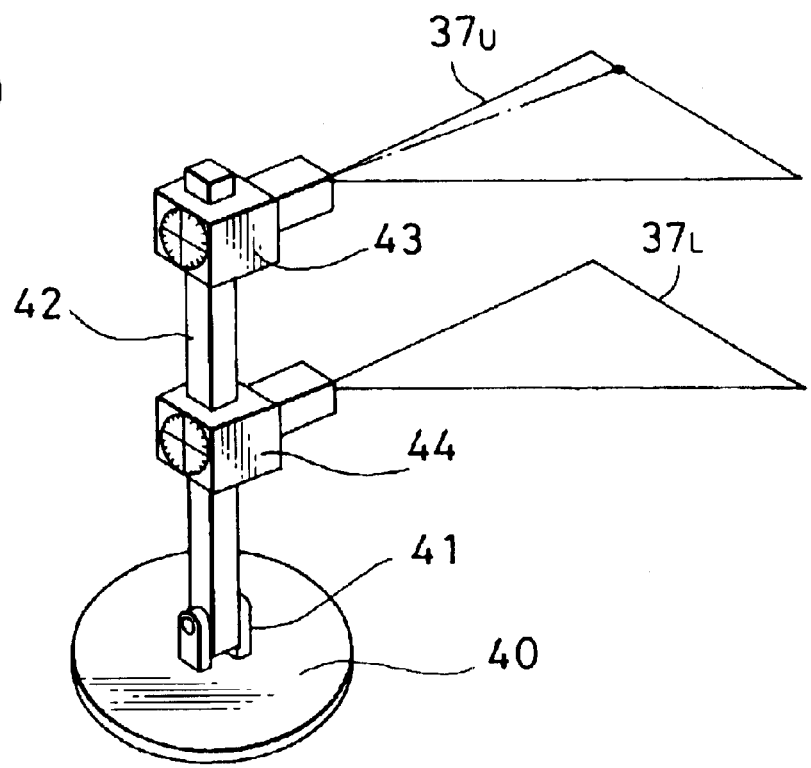
FIG. 9(A) is a perspective view of a second embodiment of the present invention.
FIG. 9(B) is a drawing to explain operation of the second embodiment.
Figure 9B:
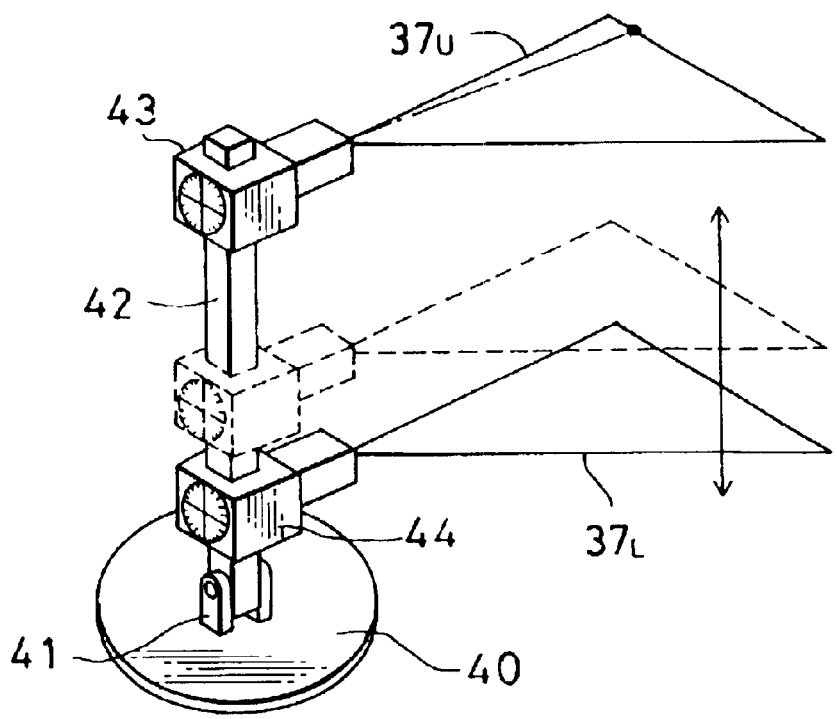

FIG. 9(A) and FIG. 9(B) each represents a second embodiment.

A guide rod 42 is pivotally supported on a base 40 via a hinge 41. The guide rod 42 can be rotated from a vertical position as shown in the figure to a horizontal position, and it can be retained at any angle as desired.

Two sets of laser projection units 43 and 44 are slidably mounted on the guide rod 42. The laser projection units 43 and 44 can be fixed at any position with respect to the guide rod 42. Either one of the laser beams 37 projected from the laser projection units 43 and 44 is used as a laser beam for reference, and the other is used as a laser beam for operation.

In the figure, the upper laser projection unit 43 is used for reference.

Figure 2:
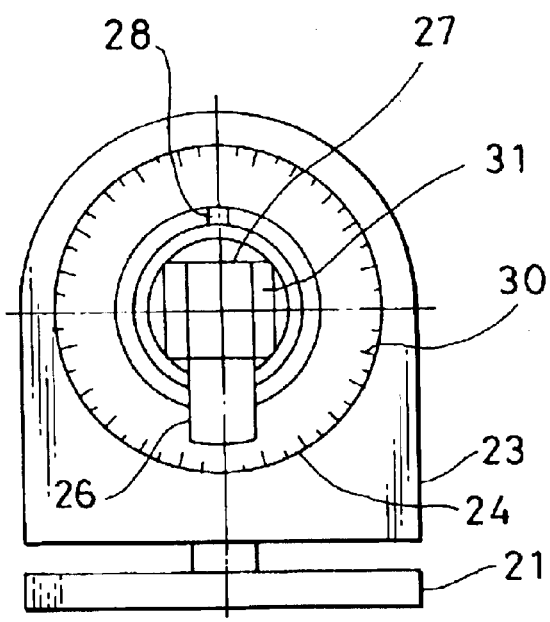
FIG. 2 is a side view of the first embodiment as seen from the right.

Each of the laser projection units 43 and 44 corresponds to the line laser device shown in FIG. 1 to FIG. 3 except the base 21. In the principle, it is equivalent to the device where the direction rotating frame 23 is slidably engaged with the guide rod 42.

As described above, each of laser beams 37U and 37L projected from the laser projection units 43 and 44 can be shifted and tilted. If it is assumed that tilt angles of the tilting frames 24 are the same for the laser projection units 43 and 44 respectively, the laser beams 37U and 37L run in parallel to each other. Even when one of the laser projection units 43 and 44 is moved along the guide rod 42, parallel conditions of the laser beams 37U and 37L are maintained.

When the guide rod 42 is tilted, the laser beams 37U and 37L are tilted while maintaining the parallel condition, and two tilted reference planes and reference lines can be easily obtained. By laying down the guide rod 42 in a horizontal direction, two vertical and parallel reference planes and reference lines can be promptly obtained.

Figure 10:
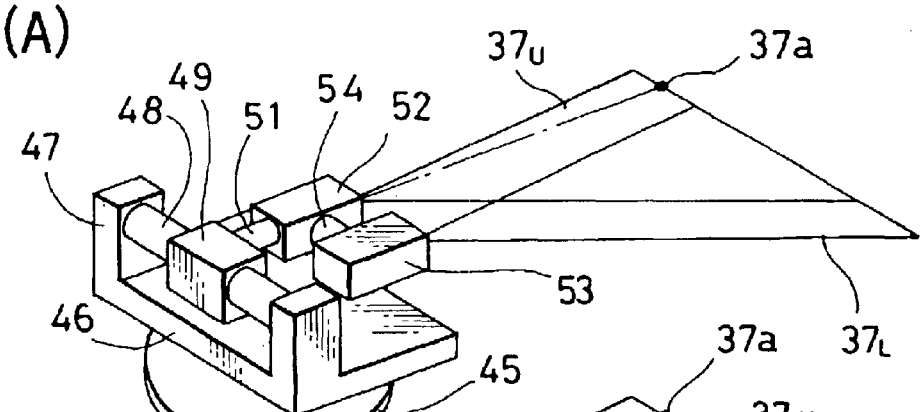
FIG. 10(A) is a perspective view of a third embodiment of the present invention.
FIG. 10(B) is a drawing to explain operation of the third embodiment.
Figure 10:
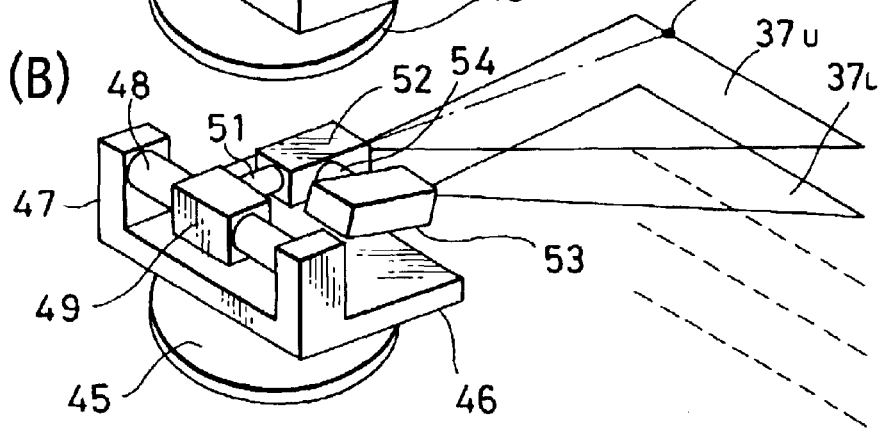

FIG. 10(A) and FIG. 10(B) each represents a third embodiment.

A horizontal rotary base 46 is rotatably mounted on a fixed base 45 so that it can be rotated around a vertical axis. Shaft supports 47 and 47 are protruded on two lateral ends of the horizontal rotary base 46. A first rotation shaft 48 is rotatably stretched between the shaft supports 47 and 47, and an elevating block 49 is fixed on the first rotation shaft 48. A second rotation shaft 51 perpendicularly crossing the first rotation shaft 48 is mounted on the elevating block 49. A laser projection unit 52 is rotatably mounted on the elevating block 49 with the second rotation shaft 51 as a rotation shaft. A third rotation shaft 54 is mounted in parallel to the first rotation shaft 48 on the laser projection unit 52. Using the third rotation shaft 54 as a rotation shaft, the laser projection unit 53 is rotatably mounted on the laser projection unit 52.

The laser projection units 52 and 53 used in the third embodiment are equivalent to the laser projection units 43 and 44 as explained in the second embodiment.

Therefore, each of the laser projection units 52 and 53 projects the laser beam 37 in fan-like shape and forms the spot light 37a, and the laser beam 37 can be shifted and rotated with the spot light 37a in a fixed state.

Further, the laser projection unit 53 can be rotated around the third rotation shaft 54 with respect to the laser projection unit 52. Thus, the laser beam 37U and the laser beam 37L running in parallel to each other and with different distances can be easily projected. The laser projection units 52 and 53 are integrally and rotatably mounted on the elevating block 49 via the second rotation shaft 51, and the laser beams 37U and 37L can be easily tilted without changing the parallel condition.

Also, the laser projection units 52 and 53 are integrally and rotatably mounted on the horizontal rotary base 46 via the first rotation shaft 48. As a result, these can be easily shifted without changing the parallel conditions of the laser beams 37U and 37L in a top-to-bottom direction. The horizontal rotary base 46 is rotatably mounted on the fixed base 45, and the laser beam 37U and the laser beam 37L can be shifted at any position over the entire circumference.

Figure 11:
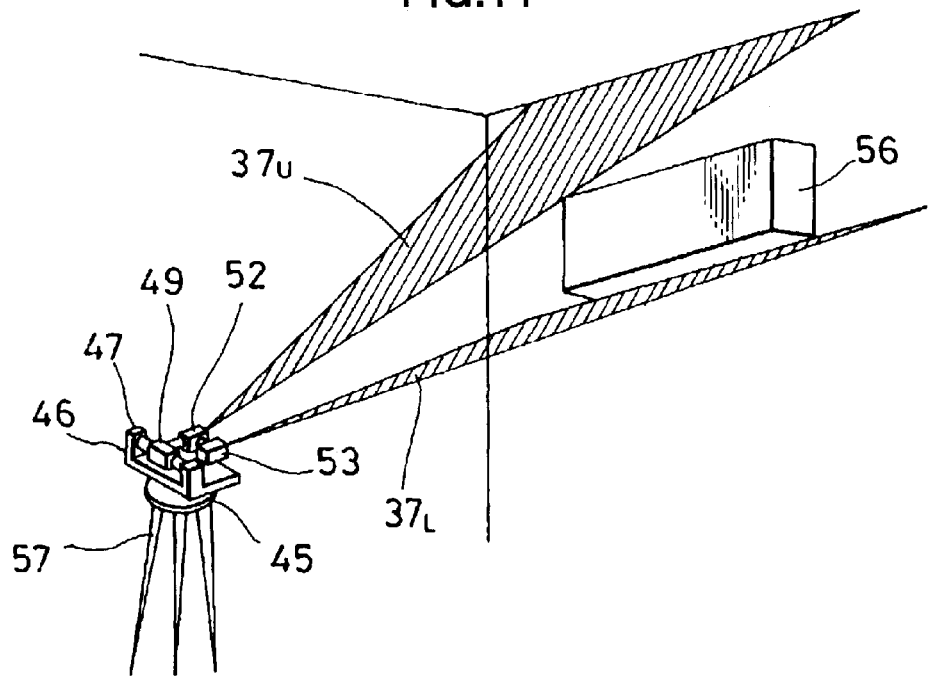
FIG. 11 is a drawing to explain condition during operation of the third embodiment.

Now, description will be given on operation using the line laser device of the third embodiment referring to FIG. 11.

In the figure, a case of a cooler 56 mounted on a wall surface is shown. To improve working efficiency, the line laser device is mounted on a tripod 57. Laser beams 37 projected to the wall surface from the laser projection units 52 and 53 indicate horizontal condition. The laser beam 37U projected from the laser projection unit 52 is used as reference, and the laser beam 37L projected from the laser projection unit 53 is used for operation.

A laser beam 37U for reference is projected from the laser projection unit 52, and a laser beam 37L for operation is projected from the laser projection unit 53.

The laser beam 37U is approximately aligned with a boundary line between a ceiling and a wall surface by rotation of the horizontal rotary base 46, by rotation of the elevating block 49, etc., and further by rotation of the laser projection unit 52 with respect to the elevating block 49, etc. In this case, the spot light is on the boundary line. The tilting frame 24 is rotated, and the laser beam 37U is aligned with the boundary line. In association with this, the laser beam 37L is also tilted. Next, the laser projection unit 53 is rotated, and the laser beam 37L is shifted to the position where the cooler 56 is installed. The laser beam 37L is running in parallel to the laser beam 37U. By the laser beam 37L, a reference line as a substitute of a marking line can be formed. In the figure, the laser beam 37L is projected to the lower end of the cooler 56 so that the laser beam 37L is not blocked by the cooler 56.

If the laser beam 37 is projected in such manner that the spot light 37a of the laser beam 37L indicates an end position where the cooler 56 is installed, it is possible to indicate a horizontal position (distance from the wall) at the same time.

Figure 12:
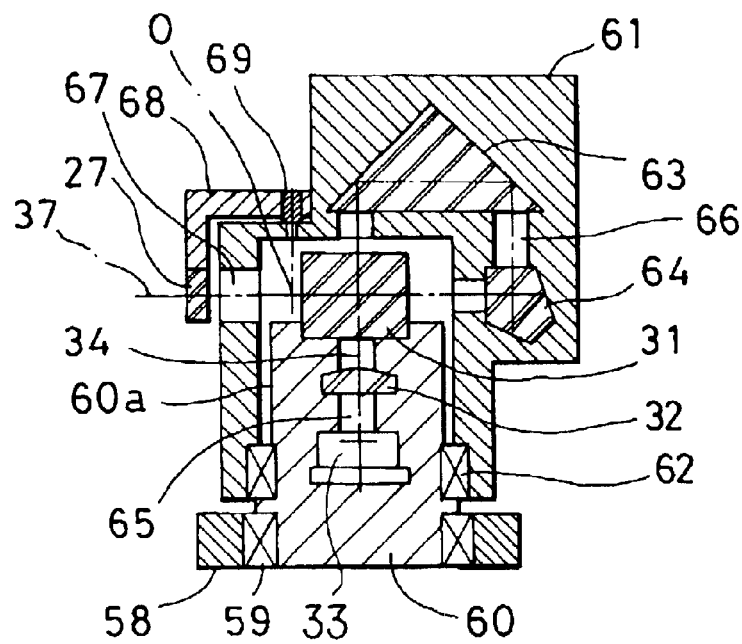
FIG. 12 is a cross-sectional view of a fourth embodiment of the present invention.

FIG. 12 shows a fourth embodiment of the present invention.

A light emitting unit holder 60 is rotatably mounted on a base 58 via a bearing 59. The light emitting unit holder 60 has a shaft portion 60a protruding upward. A laser diode 33 and a condenser lens 32 are arranged in the shaft portion 60a, and a circular cylindrical lens 31 is mounted on an upper end of the shaft portion 60a. The laser diode 33 and the condenser lens 32 are arranged on a same optical axis 34, and a center line of the circular cylindrical lens 31 concurs with the optical axis 34. The optical axis 34 is aligned with a center line of the shaft portion 60a and is running in a vertical direction.

A prism holder 61 is rotatably mounted on the shaft portion 60a via a bearing 62. A corner prism 63 and a pentagonal prism 64 are mounted on the prism holder 61. The corner prism 63 is arranged on an extension of the optical axis 34 above the circular cylindrical lens 31. The pentagonal prism 64 is under the corner prism 63 and is at a position opposite to the circular cylindrical lens 31.

The laser beam 37 emitted from the laser diode 33 is turned to a parallel beam by the condenser lens 32. After passing through the circular cylindrical lens 31, the beam is reflected in parallel by the corner prism 63. Further, the beam is deflected at a right angle and is reflected by the pentagonal prism 64. Optical path holes 65, 66, and 67 are formed on the light emitting unit holder 60 and the prism holder 61 respectively so that the laser beam 37 can pass through. The optical path hole 67 is designed as a rectangular hole longer in a horizontal direction.

An inverted L-shaped cylindrical lens holder 68 is rotatably mounted on the prism holder 61 via a shaft 69. A point where the laser beam 37 is converged (beam-converging point O) by the circular cylindrical lens 31 is on an axis of the shaft 69. A cylindrical lens 27 is fixed on a lower end of the cylindrical lens holder 68, and the focal point of the cylindrical lens 27 concurs with the beam-converging point O of the laser beam 37.

In the fourth embodiment, too, the laser beam 37 is spread in fan-like shape by the circular cylindrical lens 31 and is projected. The light beam entering the cylindrical lens 27 is turned to a parallel beam by the cylindrical lens 27, and a spot light 37a is formed. When the cylindrical lens holder 68 is rotated, the spot light 37a is formed at any position as desired within the range of the fan-shaped laser beam. By rotating the prism holder 61 around the shaft portion 60a, projecting directions of the fan-shaped laser beam and the spot light can be changed.

In the fourth embodiment, the position of the spot light can be changed by shifting the spot light along the fan-shaped laser beam.

Further, in the fourth embodiment, the corner prism 63 reflects the light in parallel to the incident light, and the pentagonal prism 64 reflects the light at a right angle with respect to the incident light. Thus, regardless of mechanical relationship between the light emitting unit holder 60 and the prism holder 61, the exit laser beam 37 runs in a horizontal direction if the optical axis 34 runs in a vertical direction. Specifically, even when there is a deflection angle, etc. between the prism holder 61 and the shaft portion 60a, the horizontal direction of the exit laser beam 37 can be guaranteed.

It is needless to say that, in the fourth embodiment, if the light emitting unit holder 60 is installed in such manner that the optical axis of the laser diode 33 is directed in a horizontal direction, a vertical reference plane can be formed.

The light beam of the laser beam 37 emitted from the laser diode 33 has an elliptical cross-section. Therefore, by rotating only the light emitting holder 60 with respect to the prism holder 61, it is possible to change a spread angle of the fan-shaped laser beam 37 projected from the circular cylindrical lens 31 because the light beam of the laser beam entering the circular cylindrical lens 31 from the pentagonal prism 63 is rotated.

Therefore, it is possible to obtain optimal spreading condition for the fan-shaped laser beam 37 depending on the operation range.

Figure 13:
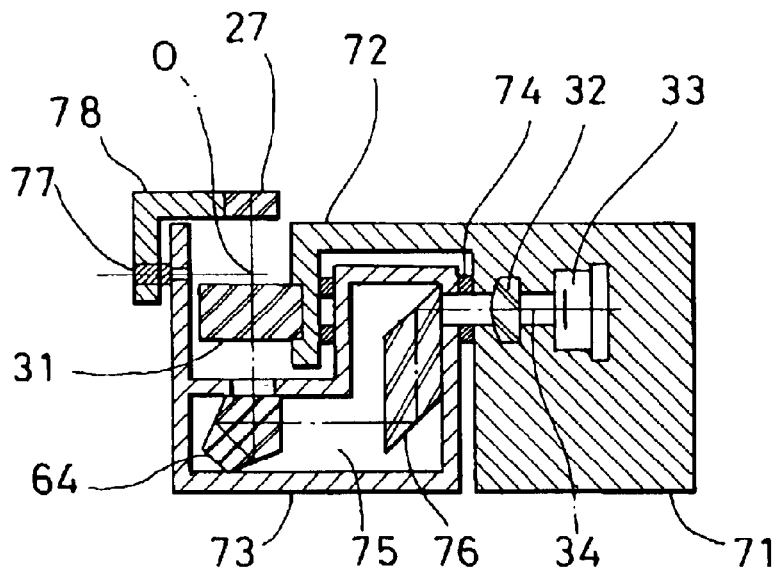
FIG. 13 is a cross-sectional view of a fifth embodiment of the present invention.
Figure 14:
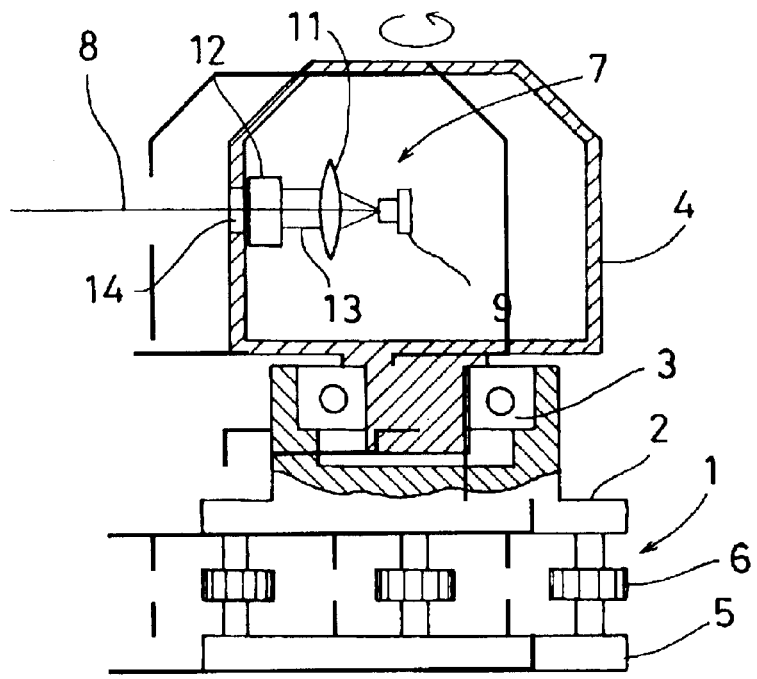
FIG. 14 is a drawing to explain a conventional type device.
Figure 15:
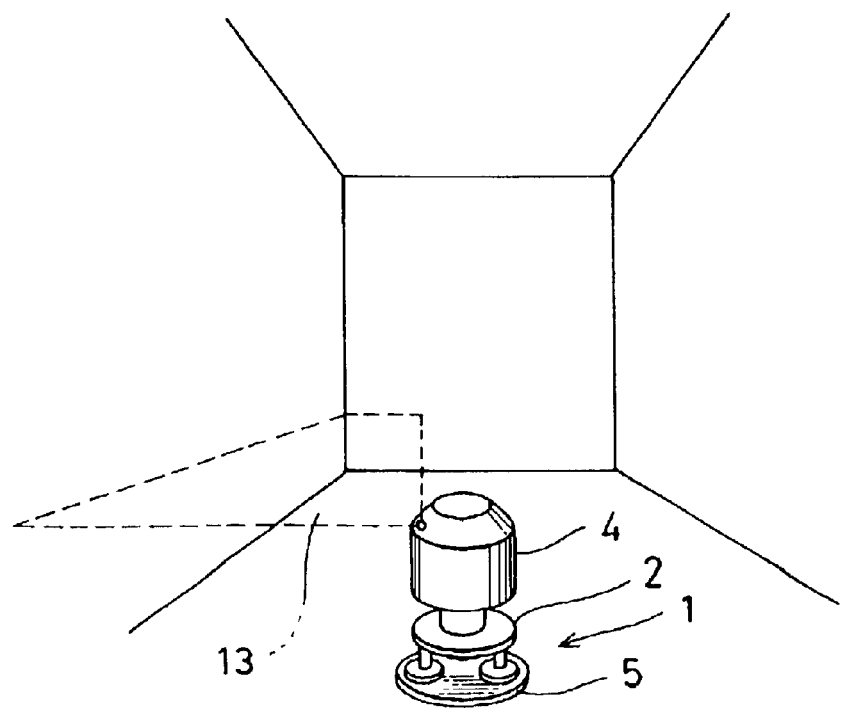
FIG. 15 is a drawing to explain the condition during operation of the conventional type device.

FIG. 13 shows a fifth embodiment of the invention. This fifth embodiment is an application embodiment of the fourth embodiment.

A laser diode 33 and a condenser lens 32 are arranged inside a light emitting unit holder 71 so that these have a horizontal optical axis 34. The light emitting unit holder 71 has a hook-like arm 72 extending in a horizontal direction. A prism holder 73 is rotatably mounted between the arm 72 and the light emitting unit holder 71 via a shaft 74. An L-shaped hollow space 75 is formed in the prism holder 73, and a rhombic prism 76 and a pentagonal prism 64 are provided in the hollow space 75.

A circular cylindrical lens 31 having an axis on an extension of the optical axis 34 of the laser diode 33 is fixed on a forward end surface of the arm 72 so that it is positioned opposite to the pentagonal prism 64. Further, an L-shaped cylindrical lens holder 78 is rotatably mounted on the prism holder 73 via a horizontal rotation shaft 77, and a cylindrical lens 27 is fixed on a forward end of the horizontal portion of the cylindrical lens holder 78. The beam-converging point O formed by the circular cylindrical lens 31 is on an axis of the rotation shaft 77, and the focal point of the cylindrical lens 27 concurs with the beam-converging point O.

The laser beam 37 emitted from the laser diode 33 is turned to a parallel beam by the condenser lens 32. The optical axis of the laser beam is shifted in parallel by the rhombic prism 76 and the beam enters the pentagonal prism 64. It is deflected perpendicularly by the pentagonal prism 64 and is turned to a vertical fan-shaped laser beam 37 by the circular cylindrical lens 31. Further, the light beam passing through the cylindrical lens 27 is turned to a parallel beam, and a spot light 37a is formed. By the rotation of the cylindrical lens holder 78, the spot light 37a can be formed at any position as desired within the range of the fan-shaped laser beam 37. Further, by rotating the prism holder 73, the projecting direction of the fan-shaped laser beam 37 can be changed.

In the fifth embodiment, the rhombic prism 76 shifts the optical axis in parallel to the incident light and the pentagonal prism 64 reflects the light perpendicularly with respect to the incident light. As a result, the exit laser beam 37 is always directed in a vertical direction if the optical axis 34 is running in a horizontal direction regardless of mechanical relationship between the light emitting unit holder 71 and the prism holder 73. That is, it is guaranteed to direct the exit laser beam in a vertical direction even when there is deviation of the center or the like between the light emitting unit holder 71 and the prism holder 73.

It is needless to say that, in the fifth embodiment, a horizontal reference plane can be formed if the light emitting unit holder 71 is installed in such manner that the optical axis 34 of the laser diode 33 is directed in a vertical direction.

In the fifth embodiment, although not shown in the figure, if the light emitting unit holder 71 is rotatably supported and the light emitting unit holder 71 is rotated with respect to the prism holder 73, the spread angle of the fan-shaped laser beam 37 projected in a vertical direction can be changed.

In each embodiment as described above, as optical means for forming the fan-shaped laser beam 37, the circular cylindrical lens 31 is used, while a cylindrical lens, a Fresnel lens or a binary element may be used.

In the above embodiments, the cylindrical lens 27 is used as the optical member to form the spot light 37a, while this may be accomplished by a spherical lens, a Fresnel lens, a binary element, or by a combination of either of a cylindrical lens, a spherical lens, a Fresnel lens, and a binary element.

The device according to the present invention comprises a light source for emitting a laser beam, a light emitting unit having optical means for projecting the laser beam from the light source in fan-like shape, an optical member arranged on the fan-shaped laser beam and for forming a spot light on a part of the fan-shaped laser beam, and support means for supporting the optical member so that the spot light formed on the fan-shaped laser beam can be shifted. As a result, by aligning the spot light with a specific point, the setting of a reference plane and a reference line can be carried out in easy manner. Further, the position of the spot can be shifted depending on the operating position and the range of operation, and working efficiency can be improved.

Also, the device according to the present invention comprises at least two sets of laser projection units and a guide member, wherein the laser projection unit comprises a light source for emitting a laser beam, a light emitting unit having optical means for emitting the laser beam from the light source in fan-like shape, an optical member arranged on the fan-shaped laser beam and for forming a spot light on a part of the fan-shaped laser beam, and support means capable to shift the optical member along the fan-shaped laser beam, wherein the two sets of laser projection units are supported as independently movable along the guide member. As a result, it is possible to set a plurality of parallel reference planes and reference lines. Each of the reference planes and the reference lines can be set in easy and simple manner by aligning the spot light to a specific point. Also, the position of the spot light can be shifted depending upon the operating position and the range of operation, and working efficiency can be improved.

Further, the device according to the present invention comprises at least two sets of laser projection units and a guide member, wherein the laser projection unit comprises a light source for emitting a laser beam, a light emitting unit having optical means for emitting the laser beam from the light source in fan-like shape, an optical member arranged on the fan-shaped laser beam and for forming a spot light on a part of the fan-shaped laser beam, and support means capable to shift the optical member along the fan-shaped laser beam, wherein the two sets of laser projection units are movably supported along the guide member, and one of the laser projection units can be rotated with respect to the other of the laser projection unit. As a result, it is possible to set a plurality of parallel reference planes and reference lines. The setting of each of the reference planes and the reference lines can be carried out in easy and simple manner by aligning the spot light with a specific point. Further, the position of the spot light can be shifted depending on the position of operation and the range of operation, and working efficiency can be improved.

Also, the device according to the present invention comprises a light emitting unit having a light source to emit a laser beam, a circular cylindrical lens, optical means for deflecting the laser beam so that the laser beam enters in a direction perpendicular to the center line of the circular cylindrical lens, optical means retaining member for rotatably supporting the optical means around the center line of the circular cylindrical lens, and an optical member movably supported along the fan-shaped laser beam by the optical means retaining member and for forming a spot light. As a result, regardless of mechanical relationship between the light emitting unit and the optical means retaining member, horizontality and verticality of the exit fan-shaped laser beam can be guaranteed. Further, the spread angle of the fan-shaped laser beam can be adjusted. The setting of each of the reference planes and the reference lines can be carried out in simple and easy manner by aligning the spot light to a specific point. Further, the position of the spot light can be shifted depending on the position of operation and the range of operation, and working efficiency can be improved.

What is claimed is:

1. A line laser device, comprising a light source for emitting a laser beam, a light emitting unit having optical means for converging the laser beam from said light source and projecting the laser beam in a fan-like shape, an optical member arranged on the fan-shaped laser beam and for forming a spot light on a part of the fan-shaped laser beam, and support means for supporting the optical member so that the light emitting unit is enabled to swing in a spreading direction of the fan-shaped laser beam around a beam-converging point of the laser beam which is converged by said optical means, wherein said fan-shaped laser beam can swing while maintaining a position of said spot light.

2. A line laser device according to claim 1, wherein said optical member and said light emitting unit are mounted on a tilting frame which is rotated around an optical axis of said spot light, and said fan-shaped laser beam can be tilted.

3. A line laser device according to claim 2, wherein said tilting frame is mounted on a rotating frame which can be rotated in at least one direction, and a direction of said spot light and a projecting direction of said fan-shaped laser beam can be shifted.

4. A line laser device according to claim 1, wherein said light emitting unit, said optical member and said support member make up a light projection unit, and two or more light projection units are supported independently movable along a guide member, wherein two or more fan-shaped laser beams which have spot lights can be shifted.

5. A line laser device according to claim 4, wherein said guide member is rotatably supported.

6. A line laser device according to claim 1, wherein said light emitting unit, said optical member and said support member make up a light projection unit, and two or more light projection units are mounted independently rotatably on a guide member, wherein two or more fan-shaped laser beams which have spot lights can be rotated.

7. A line laser device according to claim 1, wherein said optical member is arranged on said fan-shaped laser beam, the spot light is formed on the part of the fan-shaped laser beam, and portions without light beams are formed on both sides of the spot light.

8. A line laser device according to claim 1, wherein said optical means has one of a circular cylindrical lens, a cylindrical lens, a Fresnel lens, or a binary element as the optical member for diffusing a light beam of the laser beam in fan-like shape.

9. A line laser device according to claim 1, wherein the optical member to form the spot light is one of a cylindrical lens, a spherical lens, a Fresnel lens, or a binary element.

* * * * *